(12) United States Patent
Germana-Carpineto

(10) Patent No.: US 11,721,734 B2
(45) Date of Patent: Aug. 8, 2023

(54) TRANSISTOR STRUCTURE AND METHOD OF FORMING THEREOF

(71) Applicant: STMicroelectronics (Rousset) SAS, Rousset (FR)

(72) Inventor: Rosalia Germana-Carpineto, Antibes (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 126 days.

(21) Appl. No.: 17/144,585

(22) Filed: Jan. 8, 2021

(65) Prior Publication Data

US 2021/0234014 A1    Jul. 29, 2021

(30) Foreign Application Priority Data

Jan. 23, 2020   (FR) ...................................... 2000669

(51) Int. Cl.
| | | |
|---|---|---|
| *H01L 29/423* | (2006.01) | |
| *H01L 21/762* | (2006.01) | |
| *H01L 29/10* | (2006.01) | |
| *H01L 29/66* | (2006.01) | |
| *H01L 29/78* | (2006.01) | |

(52) U.S. Cl.
CPC .... *H01L 29/4236* (2013.01); *H01L 21/76224* (2013.01); *H01L 29/1095* (2013.01); *H01L 29/66734* (2013.01); *H01L 29/7813* (2013.01)

(58) Field of Classification Search
CPC ............. H01L 29/4236; H01L 29/1095; H01L 29/66734; H01L 29/7813; H01L 21/76224
USPC ....................................................... 257/330
See application file for complete search history.

(56) References Cited

U.S. PATENT DOCUMENTS

| | | | |
|---|---|---|---|
| 2005/0173758 A1* | 8/2005 | Peake | H01L 29/7397 257/E29.256 |
| 2013/0248998 A1* | 9/2013 | Misu | H01L 29/7801 257/335 |
| 2013/0334601 A1 | 12/2013 | Dong et al. | |
| 2016/0268423 A1 | 9/2016 | Koepp et al. | |
| 2017/0110545 A1 | 4/2017 | Nagao et al. | |
| 2017/0346474 A1 | 11/2017 | Xia et al. | |
| 2017/0346476 A1 | 11/2017 | Xia et al. | |
| 2017/0358650 A1 | 12/2017 | Meiser et al. | |
| 2018/0145170 A1* | 5/2018 | Dix | H01L 29/7809 |
| 2020/0006483 A1* | 1/2020 | Jovanov | H01L 29/66659 |
| 2020/0381550 A1 | 12/2020 | Germana-Carpineto | |

FOREIGN PATENT DOCUMENTS

| | | | | |
|---|---|---|---|---|
| CN | 102184944 A | * | 9/2011 | ........... H01L 29/402 |
| CN | 102184944 B | | 1/2013 | |
| DE | 102004064308 B3 | | 10/2018 | |

OTHER PUBLICATIONS

Baliga, B., "Advanced Power Rectifier Concepts," Springer, Jun. 16, 2009, 30 pages, © Springer Science+Business Media, LLC 2009.

Rosli, Khairul Affendi et al., "A Comparative Study on SOI MOSFETS for Low Power Applications", Research Journal of Applied Sciences, Engineering and Technology, Mar. 2013, 7 pages.

\* cited by examiner

*Primary Examiner* — Igwe U Anya
(74) *Attorney, Agent, or Firm* — Slater Matsil, LLP

(57) ABSTRACT

An embodiment transistor comprises a semiconductor drain region delimited by a first trench, and, in the first trench, a first electrically conductive element electrically coupled to a node of application of a potential closer to a drain potential of the transistor than to a source potential of the transistor.

20 Claims, 4 Drawing Sheets

TRANSISTOR STRUCTURE AND METHOD OF FORMING THEREOF

CROSS-REFERENCE TO RELATED APPLICATIONS

This application claims priority to French Patent Application No. 2000669, filed on Jan. 23, 2020, which application is hereby incorporated herein by reference.

TECHNICAL FIELD

The present disclosure generally relates to electronic devices and methods and, more particularly, transistors and methods of forming thereof.

BACKGROUND

In certain electronic devices, field-effect transistors are used in a non-conductive state to hold high voltages, typically greater than 10 V, for example, on the order of 40 V, or even greater than 100 V. The smaller the transistor and/or the higher the voltage held in the non-conductive state, the higher the resistance of the transistor in the conductive state.

SUMMARY

There is a need to improve, in transistors, the tradeoff between the state resistance in the conductive state, the dimensions, and the voltage held in the non-conductive state.

An embodiment overcomes all or part of the disadvantages of known transistors.

An embodiment enables to decrease the resistance in the conductive state and/or to decrease the occupied surface area and/or to increase the held voltage.

An embodiment provides a transistor comprising a semiconductor drain region delimited by a first trench, and, in the first trench, a first electrically conductive element electrically coupled to a node of application of a potential closer to a drain potential of the transistor than to a source potential of the transistor.

According to an embodiment, the transistor comprises a gate located in a second trench collinear to the first trench.

According to an embodiment, the transistor comprises, between the gate and the first conductive element, an insulating region having a thickness greater than a thickness of a gate insulator of the transistor and, preferably, a portion of the semiconductor drain region.

According to an embodiment, the transistor comprises a second conductive element located in the second trench.

According to an embodiment, the first trench extends in a substrate from a surface of the substrate, a drain contacting area of the transistor and a channel-forming area of the transistor being located on the side of the surface of the substrate.

According to an embodiment, the channel-forming area is electrically coupled to a node of application of the source potential of the transistor.

According to an embodiment, the transistor comprises a semiconductor source region delimited by the second trench and in contact with the channel-forming area on the side of the channel-forming are opposite to the semiconductor drain region.

According to an embodiment, the first trench extends in a region of the substrate partly located under the semiconductor drain region.

According to an embodiment, the channel-forming area is a portion of the region of the substrate.

According to an embodiment, the region of the substrate is insulated, by a buried well, from another region of the substrate located under the buried well, the buried well being preferably entirely located at a depth greater than that of the bottom of the first trench.

According to an embodiment, the semiconductor drain region is delimited, on a side opposite to that of the first trench, by an additional trench, and an additional electrically conductive element is located in the additional trench.

According to an embodiment, ends of the first trench and of the additional trench are aligned in a trench width direction.

According to an embodiment, the semiconductor drain region has, in a direction parallel to the first trench, a decreasing doping level from the contacting area.

An embodiment provides an electronic device comprising one or a plurality of above defined transistors.

According to an embodiment, the device is monolithic and further comprises CMOS-type transistors and/or a vertical transistor comprising trenches of same depth as the first trench.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
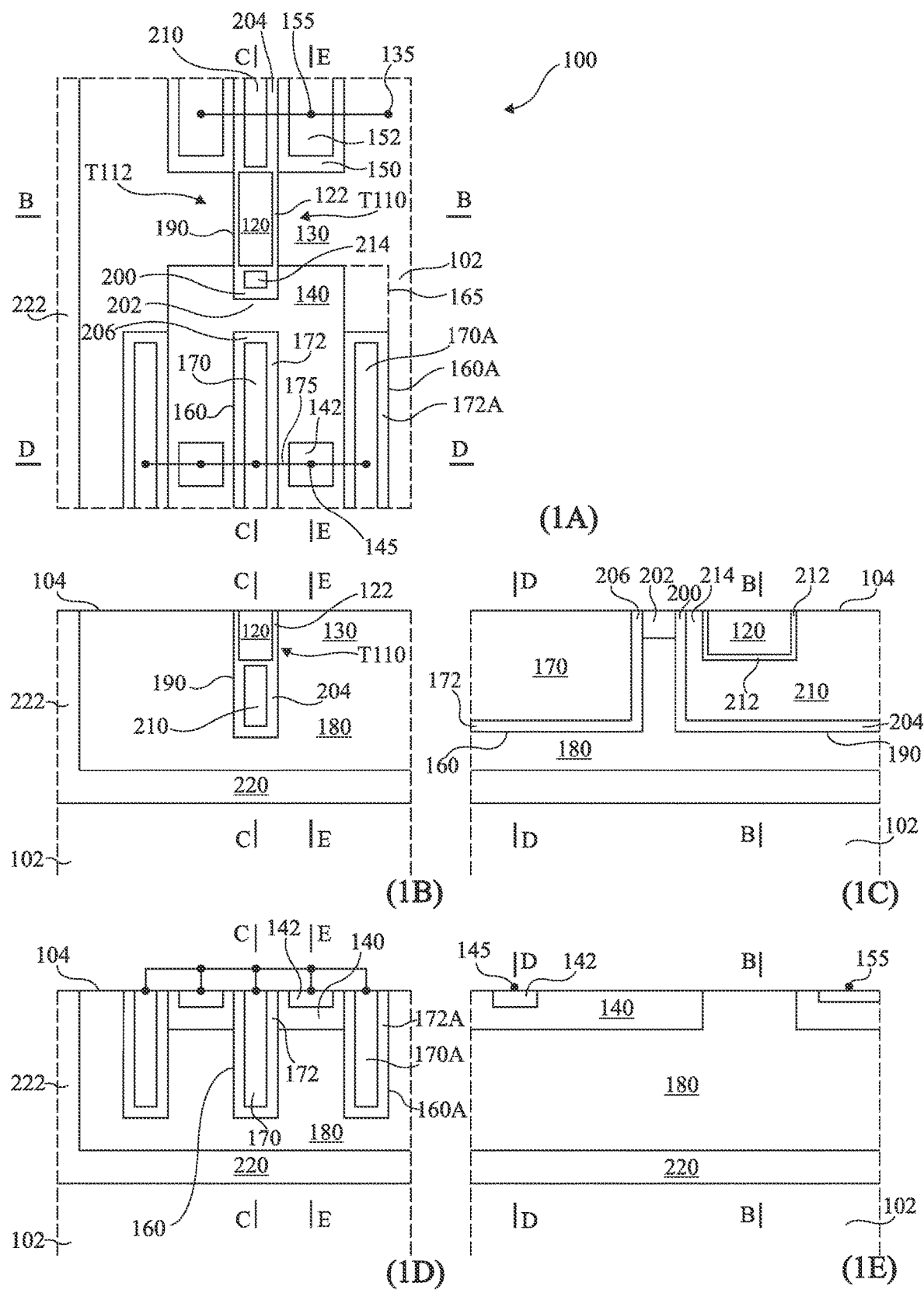
FIG. 1 partially and schematically shows a top view 1A and cross-section views 1B, 1C, 1D, and 1E of an embodiment of a device comprising a transistor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, mask manufacturing steps, doping steps, and step of manufacturing terminals electrically connected to doped areas are not detailed, the described embodiments being compatible with such usual steps.

Throughout the present disclosure, the term "connected" is used to designate a direct electrical connection between circuit elements, whereas the term "coupled" is used to designate an electrical connection between circuit elements that may be direct, or may be via one or more other elements.

In the following description, when reference is made to terms qualifying absolute positions, such as terms "top", "bottom", "left", "right", etc., or relative positions, such as terms "above", "under", "upper", "lower", etc., or to terms qualifying directions, such as terms "horizontal", "vertical", etc., it is referred to the orientation of the cross-section views.

The terms "about", "approximately", "substantially", and "in the order of" are used herein to designate a tolerance of plus or minus 10%, preferably of plus or minus 5%, of the value in question.

Unless otherwise specified, ordinal numerals such as "first", "second", etc. are only used to distinguish elements from one another. In particular, these adjectives do not limit the described embodiments to a specific order of these elements.

Figure 2:
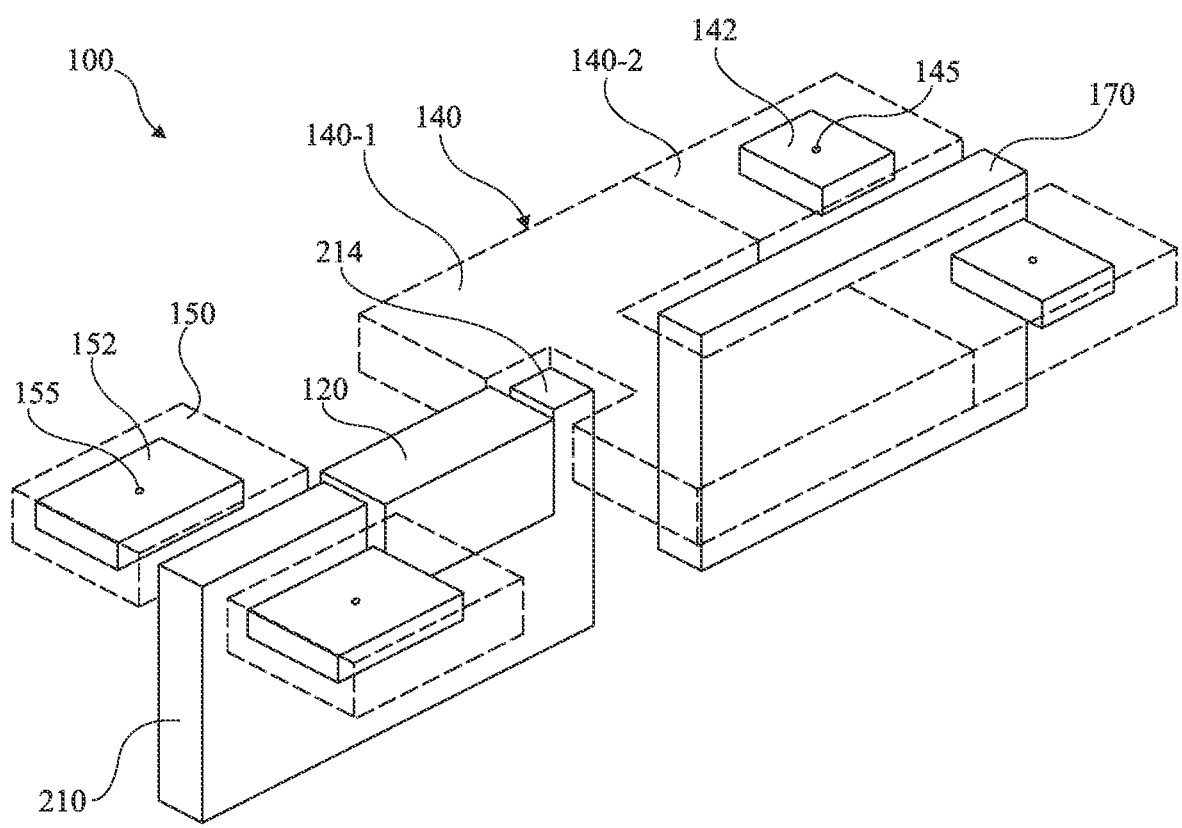
FIG. 2 partially and schematically shows a perspective view of the device of FIG. 1.

FIG. 1 partially and schematically shows a top view 1A and cross-section views 1B, 1C, 1D, and 1E of an embodiment of a device 100 comprising a transistor. Cross-section views 1B, 1C, 1D, and 1E have, as respective cross-section planes, planes B-B, C-C, D-D et E-E. Views 1A, 1B, and 1C correspond in the vertical direction of the drawings and views 1B and 1C, respectively 1D and 1E, correspond in the horizontal direction of the drawings FIG. 2 shows a partial simplified perspective view of device 100. Particularly, electric insulators, a semiconductor substrate, and a buried well are not shown in FIG. 2.

Device 100 typically comprises an electronic integrated circuit chip, defined by a semiconductor substrate 102 and elements, such as electronic components, located inside and on top of substrate 102. Device 100 is preferably monolithic. Monolithic device means that all the circuits of the device are integrated inside and on top of a same substrate or support, typically inside and on top of a same semiconductor wafer portion. Such a monolithic device, or integrated circuit, is preferably located in an integrated circuit package. Integrated circuit package means an assembly, preferably tight, having areas of connection or pins of connection to electronic circuits external to the circuit, for example, to a printed circuit board PCB, coming out of it.

In an example, substrate 102 is formed by a portion of a semiconductor wafer, for example, a silicon wafer. In another example, substrate 102 is formed by a layer located on the surface of a semiconductor wafer portion, for example, an epitaxial layer on the semiconductor wafer. Preferably, substrate 102 is a single-crystal substrate. As an example, substrate 102 is N-type doped, for example, at a doping level in the range from $2*10^{16}$ to $4*10^{16}$ atoms/cm$^3$. In the described embodiments, the N and P conductivity types, or doping types, may be exchanged. Operations similar to those described are then obtained by exchanging the signs of the voltages in device 100.

Among electronic components, device 100 comprises one or a plurality of transistors. In particular, device 100 comprises a transistor T100 or a plurality of transistors T100 electrically connected in parallel. Transistors T100 are preferably of the same type, for example, similar or identical to within manufacturing tolerances. A transistor T100 is shown in FIGS. 1 and 2. In the example of an N-type doped substrate 102, transistor T100 preferably has a P channel, in other words, transistor T100 has a channel of a conductivity type opposite to that of substrate 102.

Transistor T100 comprises a gate 120 and a channel-forming area 13o, separated by a gate insulator 122. Gate 120 comprises at least one electric conductor such as, for example, a metal and/or doped polysilicon. Gate insulator 122 is in contact with channel-forming area 130 and with at least one electric conductor of gate 120. Gate insulator 122 is typically formed of one or of a plurality of dielectric layers, for example, the gate insulator is formed of a silicon oxide layer. The thickness of gate insulator 122 is typically smaller than 15 nm, preferably in the range from 5 nm to 40 nm.

On one side of channel-forming area 13o, transistor T100 comprises a semiconductor region 14o, P-type doped in the present example. Semiconductor region 140 is in contact with channel-forming area 130. Semiconductor region 140 for example results from one or a plurality of steps of doping of a portion of substrate 102. Semiconductor region 140 is in contact with a more heavily-doped area 142 of the same type as region 140. Doped area 142 forms an area of electric contact with doped semiconductor region 140. More precisely, contact 142 forms an electric connection between doped semiconductor region 140 and a conductor 145 defining a drain terminal of transistor T100. Semiconductor region 140 is then called drain region.

On one side of channel-forming area 130 opposite to drain region 140, transistor T100 comprises a doped semiconductor region 150 of the same conductivity type as drain region 140 (here, of type P). Semiconductor region 150 is in contact with channel-forming area 130. Semiconductor region 150 for example results from one or a plurality of steps of doping of a portion of substrate 102. Semiconductor region 150 is in contact with a more heavily doped area 152 of the same type as region 150. Contacting area 152 forms an area of electric contact with semiconductor region 150. More precisely, contacting area 152 forms an electric connection between doped semiconductor region 150 and a conductor 155 defining a source terminal of transistor T100. Semiconductor region 150 is then called source region.

The transistor Tim defined by the above-described elements thus forms a field-effect transistor, that is, an electronic component capable, according to a control voltage applied between gate 120 and source terminal 155, of forming, in the channel-forming area, a conductive channel electrically connecting the drain and source regions.

Preferably, contacting areas 142 and 152 are formed of respective doped portions of substrate 102 having high doping levels, that is, greater than $5*10^{18}$ atoms/cm$^3$, preferably greater than $10^{19}$ atoms/cm$^3$. The doping level of channel-forming area 130 is preferably smaller than $2*10^{16}$ atoms/cm$^3$, and more preferably smaller than $5*10^{15}$ atoms/cm$^3$. Preferably, drain region 140 and source region 150 have low doping levels, that is, smaller than $2*10^{17}$ atoms/cm$^3$. This doping level is however preferably greater than $5*10^{16}$ atoms/cm$^3$.

In the described embodiments, transistor Tim further comprises a first trench 160. Trench 160 extends in substrate 102 from a surface 104 called front surface of substrate 102 (the front surface in the orientation of view 1A and the upper surface in the orientations of views 1B to 1E). Preferably, the depth of trench 160 is in the range from 2 µm to 3 µm. Preferably, trench 160 delimits a portion of drain region 140, that is, at least a portion of an edge of drain region 140 is formed by a portion of a wall of trench 160. In the shown example, trench 160 entirely delimits drain region 140. Preferably, trench 160 extends parallel to front surface 104 in a main or longitudinal direction of the trench. As an example, trench 160 has, in a transverse direction parallel to front surface 104, a constant width in the range from 100 to 500 nm Preferably, at least a portion of drain region 140 extends parallel to the edge of first trench 160 from drain contacting area 142 towards channel-forming area 130. This portion of drain region 140 is called drift region. As an example, the distance separating channel-forming area 130 from contacting area 142 is in the range from 1 to 5 µm, preferably from 2 to 4 µm.

In the non-conductive state of transistor T100, the drift region, due to its low doping level, holds a high voltage, such as mentioned as a preamble, between channel-forming area 130 and contacting area 142. In the conductive state of transistor T100, a current flowing through transistor T100 flows through the drift region, from channel-forming area 130 to contacting area 142.

Transistor T100 further comprises a first conductive element 170 located in first trench 160. Conductive element 170 is located opposite at least a portion of drain region 140, that is, at least a portion of conductive element 170 is located in a portion of trench 160, this portion delimiting at least a portion of drain region 140. More precisely, conductive element 170 is located opposite at least a portion of the drift region. Preferably, conductive element 170 is located against an electrically-insulating layer 172 located in trench 160 against at least a portion of drain region 140 and, in particular, against at least a portion of the drift region. Insulating layer 172 then separates conductive element 170 from the drift area. The distance between conductive element 170 and drain region 140, equal to the thickness of insulating layer 172, is for example in the range from 100 nm to 210 nm, preferably in the range from 120 nm to 180 nm. Insulating layer 172 preferably has a thickness greater than that of gate insulator 122. As an example, insulating layer 172 is made of silicon oxide or of silicon nitride.

Preferably, first conductive element 170 is formed by a conductive wall located in a central portion of first trench 160. The wall is elongated in the same direction as trench 160. The wall extends in substrate 102 orthogonally to front surface 104. As an example, the wall comprises, preferably is made of, a metallic material or, preferably, doped polysilicon. The width of the conductive wall, taken in the direction of the width of trench 160, is for example in the range from 30 nm to 210 nm First conductive element 170 is electrically coupled, preferably electrically connected, to a node of application of a potential closer to a drain potential of transistor T100 than to a source potential of transistor T100. Preferably, the potential applied to this node is approximately equal, more preferably equal, to the drain potential. More preferably still, this node is defined by drain terminal 145. In other words, transistor T100 then comprises an electric coupling 175, preferably an electric connection, between conductive element 170 and drain contact area 145.

Thereby, in operation, conductive element 170 is biased to a potential closer to the drain potential of transistor T100 than to the source potential of transistor T100. In the example where transistor T100 has a P channel, the potential applied to conductive element 170 is preferably smaller than or equal to that of the drain. In this example, for source, drain, and gate potentials positive with respect to a reference potential such as that of a ground, conductive element 170 may optionally be coupled or connected to ground instead of being connected to drain terminal 145.

In the non-conductive state of transistor T100, first conductive element 170 shields a portion of the electric field due to the voltage between channel-forming area 130 and contacting area 142. The electric field in the drift region is thus lower than if conductive element 170 was not provided. This enables, with respect to a transistor which would not comprise conductive element 170, to increase the doping level of the drift region and thus to increase the electric conductivity type of the drift region in the conductive state, without decreasing the maximum voltage that the transistor can hold. The tradeoff between the conductance of the transistor in the conductive state and the maximum voltage that the transistor can hold is thus improved.

According to an embodiment, drain contacting area 142 and channel-forming area 130, and, preferably, source contacting area 152, are located on the side of front surface 104, that is, they each have, on the front surface side, a surface which is not covered with a portion of the substrate. Preferably, channel-forming area 130 may be in electric contact with a contacting area, not shown, forming an electric connection between channel-forming area 130 and a terminal 135. Terminals 135, 145, and 155 may be defined by conductors located on the contacting areas, for example, vias crossing an insulating layer (not shown) covering device 100. Connections enabling to electrically couple transistor T100 to other components of the device or to an external device are then easier to form than in examples where contacting area 142 is located on the rear surface side (surface of substrate 102 opposite to front surface 104).

Preferably, source contacting area 152 is electrically coupled, preferably connected, to channel-forming area 130. More preferably, this is obtained by a coupling, preferably a connection, between terminal 155 and 135. As a result, the forming of the conductive channel between drain region 140 and source region 150 is a function of the voltage between source terminal 155 and gate 120 of transistor T100.

According to an embodiment, drain region 140 is located on a region 180 of substrate 102. Region 180 is preferably of same doping type, here, type N, as substrate 102, and has the same doping level as the doping level of substrate 102 before the forming of doped drain region 140 and source region 150 and of contacting areas 142 and 152. In other words, region 180 is then a portion of substrate 102 which, after the forming of substrate 102, has not been doped or intentionally doped.

In particular, in the case where transistor T100 has a channel of a conductivity type opposite to that of substrate 102, region 180 is partly located under drain region 140. In this case, preferably, region 180 also comprises channel-forming region 130. In a variation, transistor T100 may be formed with a channel of a conductivity type opposite to that of substrate 102 inside and on top of a doped region extending in substrate 102 deeper than transistor T100 and having a conductivity type opposite to that of substrate 102. As compared with this variation, the fact of providing for region 180 to comprise channel-forming area 130 enables to more easily obtain the channel region and the drain region, particularly the desired doping level of the channel region.

According to an embodiment, first trench 160 extends, from front surface 104, down to a depth greater than that of drain region 140. For example, drain region 140 extends, from front surface 104, down to a depth in the range from 0.5 µm to 1 µm. The depth of trench 160 is for example greater by from 1 µm to 2 µm than that of drain region 140. More particularly, trench 160 extends in region 180.

It could have been devised to form, on a substrate such as substrate 102, a transistor with a channel having a conductivity type opposite to that of the substrate, without providing a conductive element such as conductive element 170. As compared with such a transistor, the fact of providing conductive element 170 coupled to a node of application of a potential closer to that of the drain than to that of the source enables to limit, in the non-conductive state of transistor Tim, the electric field withstood by the PN junction between drain region 140 and region 180 of substrate 102. More particularly, the biasing of conductive element 170 to a potential substantially equal, preferably equal, to that of the drain enables to minimize the electric field withstood by the PN junction. This increases the maximum voltage that transistor Tim can hold.

To increase the maximum voltage that a transistor can hold, it could have been devised to decrease the doping level of its drain region. This would however increase the resistance of the drift region, and thus the resistance of the transistor in the conductive state. Conductive element 170 biased to a potential closer to that of the drain than to that of the source enables to increase the maximum voltage held by transistor Tim without decreasing the doping level of the drift region, and thus without increasing the resistance of the transistor in the conductive state.

Thus, a transistor comprising no conductive element such as conductive element 170 or comprising a conductive element similar to conductive element 170 but biased to a potential relatively close to that of the source, for example, to the source potential, could have been provided. As compared with such a transistor, the fact of providing conductive element 170 biased to a potential relatively close to that of the drain, for example, to the drain potential, improves the tradeoff between the conductance of the transistor in the conductive state and the maximum voltage capable of being held by the transistor.

According to an embodiment, drain region 140 is delimited, on a side opposite to first trench 160, by an additional trench 160A. Drain region 140 is then located between trenches 160 and 160A. Additional trench 160A is parallel to first trench 160, that is, trenches 160 and 160A have the same elongation direction. More preferably, additional trench 160A contains the same elements as first trench 160, arranged symmetrically with respect to drain region 140, that is, an additional conductive element 170A symmetrical to first conductive element 170, located opposite at least a portion of the drift region, and separated from drain region 140 by an insulating layer 172A. Thus, preferably, conductive elements 170 and 170A both penetrate into region 180 of substrate 102. Additional conductive element 170A is also coupled, preferably connected, to a node of application of the drain potential, for example, to drain terminal 145.

Additional conductive element 170A provides an additional improvement of the tradeoff between the conductance of the transistor in the conductive state and the maximum voltage that can be held by the transistor.

In the above-described example of additional trench 160A, additional trench 160A has its end aligned, in the trench width direction, with the end of first trench 160. However, in a variation shown by dotted lines 165 in view 1A, additional trench 160A may extend, from its portion located opposite contacting area 142 and towards channel-forming region 130, farther away than first trench 160. For example, additional trench 160A delimits the entire edge of drain region 140 opposite to first trench 160. In a variation, first trench 160 is omitted and only additional trench 160A is provided.

According to an embodiment, gate 120 is located inside of a second trench 190. Preferably, trenches 160 and 190 are collinear in a same elongation direction. More preferably, trenches 160 and 190 have a same width and a same depth. Gate 120 preferably has a shape elongated in the longitudinal direction of trench 190. Preferably, gate 120 is located in trench 190 on the side of front surface 104 (that is, in the upper portion of trench 190 in views 1B, 1C, 1D, and 1E). For example, gate 120 is flush with front surface 104 of substrate 102.

Thus, second trench 190 delimits channel-forming area 130. More precisely, the channel-forming area then has a lateral surface formed by a portion of the wall of trench 190. Gate insulator 122 covers this portion of the wall of trench 190. Channel-forming area 130 preferably corresponds to a portion of region 180 of substrate 102 located opposite gate 120.

Due to the fact that gate 120 is in second trench 190, the conductive channel which forms in the conductive state is located against the wall of trench 190. As compared with a variation where gate 120 is arranged on channel-forming area 130 (for example, resting on front surface 104), it is avoided for the conduction channel to have as a width that of trench 190. The trench width can then be decreased without decreasing the width of the conduction channel and thus without increasing the resistance of the transistor in the conductive state. Thus, the surface area occupied by transistor T100 is, for a same current and a same conductive state resistance, smaller than that of a transistor having its gate located on the channel area.

According to an embodiment, transistor T100 comprises, between gate 120 and first conductive element 170, an insulating region 200. Insulating region 200 has, in the longitudinal direction of trench 190, a thickness greater than that of gate insulator 122. For example, the thickness of insulating region 200 is equal to that of insulating layer 172 covering the walls of first trench 160. Insulating region 200 is, in the shown example, formed of a portion of an insulating layer 204 covering the walls of second trench 190. The insulating layer 204 of second trench 190 may have the same thickness and be made of the same materials as the insulating layer 172 of first trench 160.

When transistor T100 is in the non-conductive state, the voltage between gate 120 and drain terminal 145 ends up between gate 120 and first conductive element 170. Insulating region 200, having a thickness greater than that of gate insulator 122 and located between gate 120 and first conductive element 170, avoids the risk of breakdown of an insulator having a thickness, for example, in the order of that of gate insulator 122. For this purpose, the thickness of insulating region 200 is provided to withstand the above-defined high voltages. For example, this thickness is in the range from 100 nm to 210 nm, preferably in the range from 120 nm to 180 nm. As an example, insulating region 200 and, preferably, insulating layer 204, are made of silicon oxide or of silicon nitride.

Preferably, a semiconductor region 202, P-type doped in the shown example, is further provided between gate 120 and first conductive element 170. In other words, semiconductor region 202 is of the same conductivity type as drain region 140. Semiconductor region 202 may be obtained in a same doping step as drain region 140, and may have a same doping level. In other words, conductive region 202 then forms a portion of drain region 140. In the non-conductive state of the transistor, semiconductor region 202 is depleted and thus takes part in the electric insulation between gate 120 and first conductive element 170.

More preferably, one also provides, between gate 120 and first conductive element 170, another insulating region 206, more preferably formed by a portion of insulating layer 172 covering the walls of first trench 160. In a variation, trenches 160 and 190 are two portions of a same trench, and insulating region 200 is an insulating element located in the trench. However, as compared with this variation, the fact of providing two insulating regions 200 and 206 covering the walls of the two different trenches 160 and 190 enables to ease the forming of the electric insulation.

According to an embodiment, drain region 140 has, from contacting area 142, decreasing doping levels. In the shown example, drain region 140 comprises two sub-regions 140-1 and 140-2 (only shown in FIG. 2). Sub-region 140-1 is in contact with the channel-forming area.

In a preferred example, sub-region 140-2 separates sub-region 140-1 from contacting area 142. Sub-region 140-2 extends from contacting area 142, for example is located under and around contacting area 142. From contacting area 142, a portion of sub-region 140-2 extends towards channel-forming area 130 over a distance for example in the range from one third to two thirds, preferably substantially half, of the distance between contacting area 142 and channel-forming area 130. This portion of sub-region 140-2 extends from contacting area 142 over a distance for example in the range from 0.5 μm to 1.5 μm, preferably in the order of 1 μm. The doping level of sub-region 140-2 is in the range from that of region 140-1 to that of contacting area 142. The doping level of sub-region 140-2 may be in the range from $10^{17}$ to $10^{18}$ atoms/cm$^3$.

This preferred example is not limiting, and drain region 140 may comprise or be formed by a number N of semiconductor sub-regions 140$i$, index i being in the range from 1 to N. Sub-region 140-N extends from contacting area 142. The sub-regions are placed according to a decreasing index i from contacting area 142, the doping level of sub-regions 140-$i$ is an increasing function of index i. As a variation, semiconductor region 140 may have a doping level gradient from contacting area 142.

Sub-regions 140$i$, for i different from 1, or the sub-region with a doping gradient, form an area with a doping level intermediate between that of sub-region 140-1 and that of contacting area 142. The fact for the doping level of drain region 140 to be decreasing from contacting area 142 provides an additional improvement of the tradeoff between the conductive state conductance of the transistor and the maximum voltage capable of being held by the transistor.

According to an embodiment, second trench 190 extends towards source region 150 and delimits at least a portion of source region 15o. Transistor T100 then comprises a second conductive element 210 in trench 190, located opposite at least a portion of source region 15o. Second conductive element 210 is separated from the walls of trench 190 by insulating layer 204. Second conductive element 210 is preferably collinear with first conductive element 170. More preferably, second conductive element 210 has, in a plane orthogonal to that of trench 190 and over at least part of the length of trench 190, a cross-section of same shape and dimensions as those of the cross-section of the first conductive element 170. In the case where gate 120 is located in trench 190, second conductive element 210 is preferably partly located under gate 120. In this case, conductive element 210 and gate 120 are preferably separated by an insulator 212. Insulator 212 then preferably has a thickness equal or substantially equal to that of gate insulator 122.

Preferably, second conductive element 210 further comprises a portion 214 located between gate 120 and insulating region 200. As compared with a variation where this portion is omitted, this enables, when gate 120 is formed after insulating region 200, to solve various problems of alignment of gate 120 with the edge of insulating region 200. For example, such alignment problems are avoided when transistor T100 is formed according to the method described hereafter in relation with FIGS. 3 and 4.

According to an advantage, transistors called vertical transistors, not shown, may further be provided in device 100. In such transistors, in the conductive state, the current flows vertically (that is, orthogonally to the front surface of the substrate) between a channel-forming area located on the front surface side and a drain contacting area located on the rear surface. The vertical transistor may comprise trenches comprising conductive elements intended to shield the electric field in a drift region when the vertical transistor is in the non-conductive state. Preferably, the trenches of the vertical transistors have the same depth as first trench 160 and the possible second trench 190. Preferably, the trenches of the vertical transistors are repeated with the same pitch as that which separates first trench 160 from additional trench 160A. Preferably, the trenches of the vertical transistors have the same direction as the trench(es) of transistor T100. To obtain, in the same device, transistor T100 and the vertical transistors, steps of manufacturing transistor T100 and the vertical transistors may then be simultaneous. A device comprising, on a same substrate or a same semiconductor wafer, both vertical transistors and transistors such as transistor T100 is then particularly simple to manufacture.

According to an embodiment, device 100 comprises, in addition to transistor T100, a transistor T112 symmetrical to transistor T100 with respect to first trench 160, to within manufacturing tolerances. First trench 160 and first conductive element 170 are then common to the two transistors T100 and T112. Gate 120 may also be common to the two transistors T100 and T112, as well as the elements located between common gate 120 and first conductive element 170. The possible second trench 190 and second conductive element 210 may also be common to the two transistors T100 and T112.

According to an embodiment, device 100 comprises a well 220 buried in substrate 102. In other words, buried well 220 has a conductivity type (here, type P) opposite to that of substrate 102 (here, of type N), and is located under the region 108 of substrate 102 and on another region of substrate 102. A doped region 222 of the same conductivity type as buried well 220 extends from the periphery of buried well 220 all the way to front surface 104. Only one side of doped region 222 is shown. Doped region 222 and buried well 220 can be biased together. In the case where substrate 102 is of type N, the bias potential of buried well 220 and of doped region 222 is smaller than that of region 180 of substrate 102. For example, doped region 222 and buried well 220 are biased to a potential smaller than or equal to that of the drain, preferably to the ground potential. Doped region 222 and buried well 220 thus enable to electrically insulate region 180 from the rest of substrate 102. Transistor T100 is then insulated from other components of device 100, for example, from other transistors.

Thus, according to an advantage, transistors of complementary metal oxide semiconductor type, CMOS, may further be provided in device 100. It should be noted that the metal oxide semiconductor, MOS, type used to designate, at the origin of this denomination, transistors having a metal gate and an oxide gate insulator. However, the MOS type is now, due to the development of this type of transistor, understood as encompassing field-effect transistors having their gate made of any electric conductor, and having their gate insulator made of any dielectric or electric insulator. The manufacturing of transistor T100 may comprise steps common with the manufacturing of CMOS transistors. In particular, the doped drain 140 and source 150 regions and contacting areas 142 and 152 may be formed at the same time as doped regions and contacting areas of the CMOS transistors. Buried well 220 may also be formed at the same time as possible other wells buried under the CMOS transistors.

Preferably, the trench(es) of transistor T100 do not reach buried well 220. It is thus avoided for a conductive channel to risk being created in region 180 along the surfaces of first trench 160 opposite first conductive element 17o. Such a conductive channel would risk causing a parasitic current between drain region 140 and buried well 220.

Preferably, device 100 comprises a plurality of transistors T100 and T112, more preferably repeated in an array. Thus, the transistors are repeated in a first direction parallel to front surface 104 and in a second direction parallel to front surface 104 and orthogonal to the first direction. The possible buried well 220 is preferably common to transistors T100 and/or T112.

In a preferred example, the drain terminals 145 of transistors T100 and T112 of the array are interconnected, the source terminals 155 of transistors T100 and T112 of the array are interconnected, and the gates 120 common to each pair of transistors T110/T112 of the array are interconnected. Thus, transistors T100 and/or T112 are electrically in parallel and are controlled in parallel, which enables to conduct, through the parallel association of the transistors, high currents, that is, of more than 1 A, for example, of more than 5 A, or even of more than 50 A. Such an association corresponds to a transistor formed of elementary transistors T100 and/or T112.

Thus, the transistor formed of elementary transistors T100 and/or T112 enables high currents to flow and enables, as mentioned, to improve the tradeoff between the maximum held voltage and the resistance in the conductive state.

Figure 3:
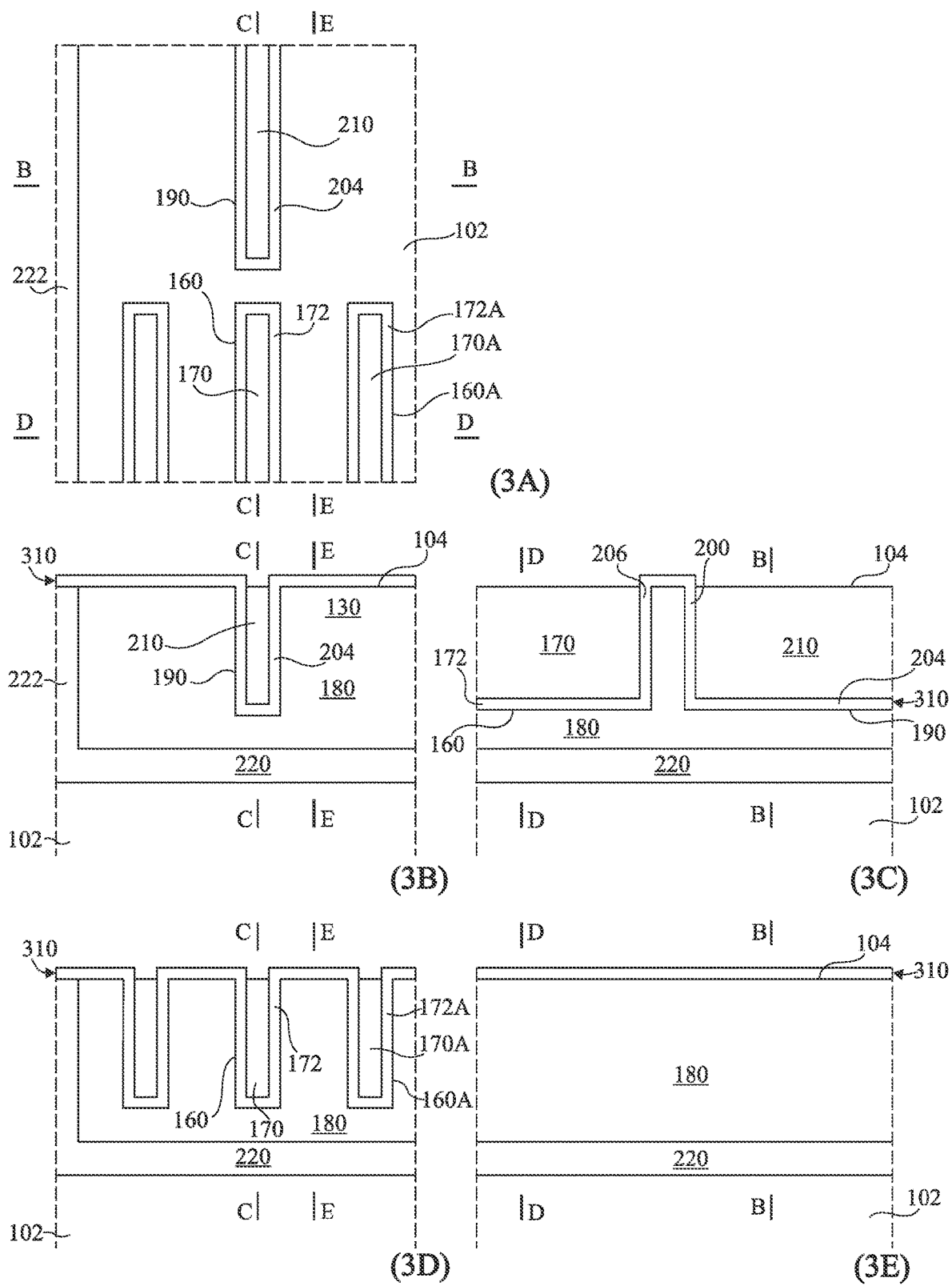
FIG. 3 partially and schematically shows a top view 3A and cross-section views 3B, 3C, 3D, and 3E of a step of an example of a method of manufacturing the device of FIG. 1.
Figure 4:
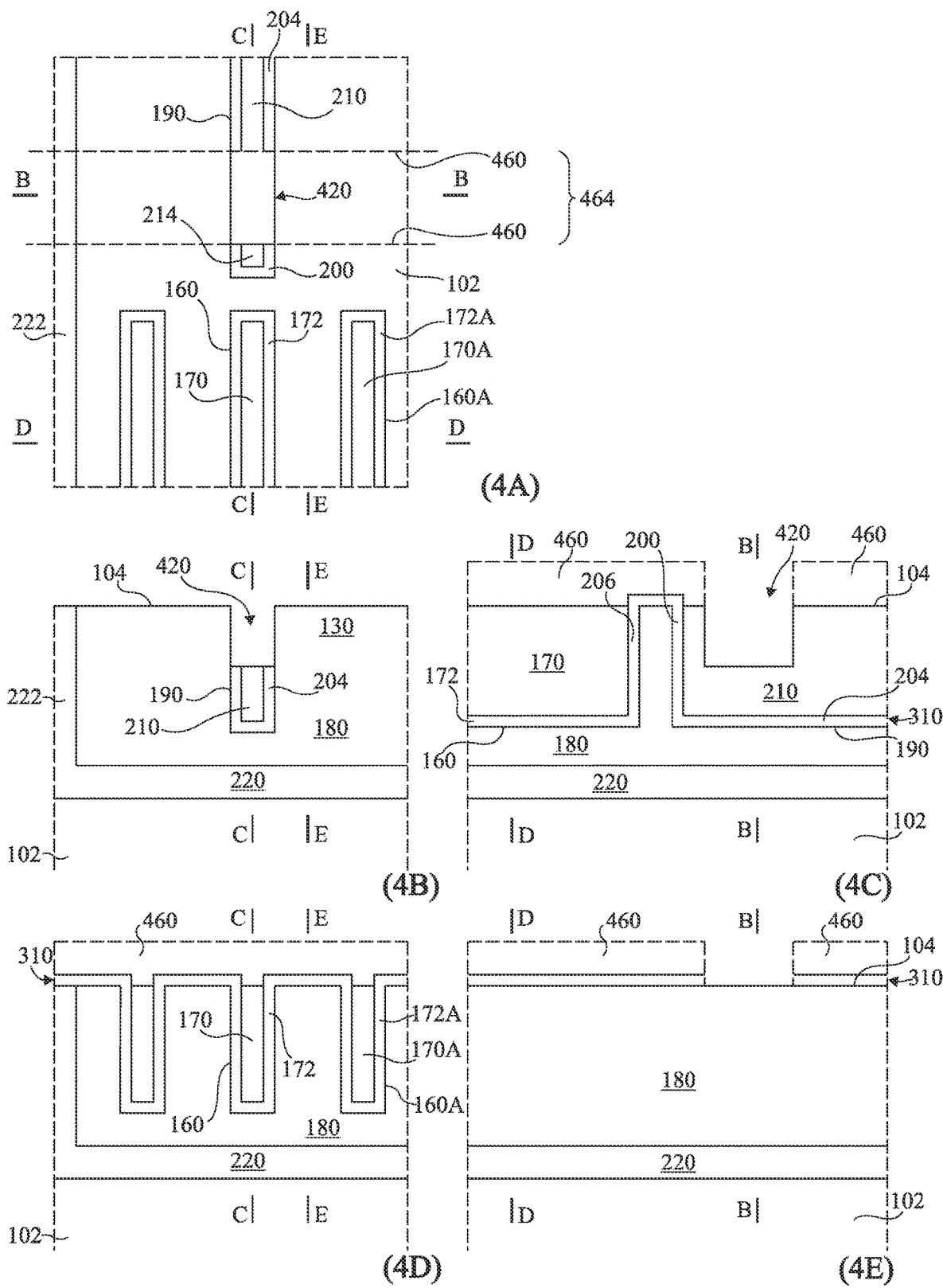
FIG. 4 partially and schematically shows a top view 4A and cross-section views 4B, 4C, 4D, and 4E of another step of the method.

FIGS. 3 and 4 partially and schematically illustrate steps of an example of a method of manufacturing device 100 of FIG. 1. More precisely, FIG. 3 shows a top view 3A and cross-section views 3B, 3C, 3D, and 3E at a same step and FIG. 4 shows a top view 4A and cross-section views 4B, 4C, 4D, and 4E at another step. The cross-section planes are respectively the same as those of FIG. 1.

At the step of FIG. 3, substrate 102 is provided. Optionally, buried well 220 is formed under region 180. Buried well 220 may be formed at this step or at a subsequent step of the method.

Trenches 160, 160A, and 190 are then etched in substrate 102, preferably all the way to a level located less deeply in substrate 102 than buried well 220. After this, an electrically insulating layer 310 having portions which will form the future insulating regions 200 and 206 and the future insulating layers 172, 172A, and 204 of the respective trenches 160, 160A, and 190 is formed on the walls and the bottom of the trenches. As an example, layer 310 is obtained by a conformal deposition covering the structure resulting from the etching of the trenches. Insulating layer 310 is preferably made of silicon oxide or of silicon nitride. The thickness of insulating layer 310 is smaller than the half-width of the trenches, to leave an unfilled space in the central portion of the trenches.

Then, the remaining space of the trenches is filled, preferably, with doped polysilicon. This results in conductive elements 170, 170A, and 210 located in the respective trenches. As an example, the entire structure resulting from the deposition of insulating layer 310 is covered with polysilicon and the polysilicon located above a given level is removed by etching. This given level is preferably that of front surface 104 of substrate 102 or is located at a height lower than 10 nm above front surface 104 of substrate 102.

At the step of FIG. 4, at location 420 of gate 120 and of gate insulator 122, the portions of insulating layer 310 and of the conductive material of second conductive element 210 are removed. Preferably, for this purpose, a mask 460 (shown in dotted lines) leaving access to a portion 464 of the upper surface of the structure has been previously formed. Preferably, portion 464 has in top view a strip shape having its main direction, or elongation direction, orthogonal to the trench length direction. The portions of the conductive material of second conductive element 210 located in strip 464 are etched, selectively over insulating layer 310, all the way to the upper level of the portion of conductive element 210 located under gate 120. Insulating layer 310 protects substrate 102 during the etching of the conductive material of second conductive element 210. Then, the accessible portions of insulating layer 310, particularly those which have been made accessible by the etching of the conductive material of conductive element 210, are selectively etched over substrate 102.

At a subsequent step, not shown, gate insulator 122 is formed on the walls of second trench 190 accessible in strip 464. One forms, preferably simultaneously to gate insulator 122, the insulator 212 intended to insulate second conductive element 210 from the future gate 120. This may be obtained by a thermal oxidation. Gate 120 is then formed. Doped regions 140, 142, 150, and 152 may be formed by doping of substrate 102 before or after the above-described steps.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereinabove.

What is claimed is:

1. A transistor comprising:
   a semiconductor drain region delimited by three sides of a first trench;
   a first electrically conductive element located in the first trench; and
   a first node electrically coupled to the first electrically conductive element, the first node configured to be coupled to a first potential closer to a drain potential of the transistor than to a source potential of the transistor.

2. The transistor of claim 1, further comprising a gate located in a second trench collinear with the first trench.

3. The transistor of claim 2, further comprising, between the gate and the first electrically conductive element, an insulating region having a first thickness greater than a second thickness of a gate insulator of the transistor.

4. The transistor of claim 2, further comprising a second conductive element located in the second trench.

5. The transistor of claim 1, wherein the first trench extends into a substrate from a surface of the substrate, and wherein a drain contacting area of the transistor and a channel-forming area of the transistor are located on a side of the surface of the substrate.

6. The transistor of claim 5, wherein the channel-forming area is electrically coupled to a second node configured to be coupled to the source potential of the transistor.

7. The transistor of claim 5, further comprising:
   a gate located in a second trench collinear with the first trench; and
   a semiconductor source region delimited by the second trench, and in contact with the channel-forming area on a side of the channel-forming area opposite to the semiconductor drain region.

8. The transistor of claim 5, wherein the first trench extends into a region of the substrate partly located under the semiconductor drain region.

9. The transistor of claim 8, wherein the channel-forming area is a portion of the region of the substrate.

10. The transistor of claim 8, wherein the region of the substrate is insulated, by a buried well, from another region of the substrate located under the buried well.

11. The transistor of claim 10, wherein the buried well is entirely located at a depth greater than that of a bottom of the first trench.

12. The transistor of claim 1, wherein the semiconductor drain region is delimited, on a side opposite to that of the first trench, by an additional trench, and wherein an additional electrically conductive element is located in the additional trench.

13. The transistor of claim 12, wherein ends of the first trench and of the additional trench are aligned in a trench width direction.

14. The transistor of claim 1, wherein the semiconductor drain region has, in a direction parallel to the first trench, a decreasing doping level from a contacting area.

15. An electronic device comprising:
one or more transistors, each of the one or more transistors comprising:
a semiconductor drain region delimited by three sides of a first trench;
a first electrically conductive element located in the first trench; and
a first node electrically coupled to the first electrically conductive element, the first node configured to be coupled to a first potential closer to a drain potential of the transistor than to a source potential of the transistor.

16. The electronic device of claim 15, wherein the electronic device is monolithic and further comprises:
complementary metal-oxide-semiconductor (CMOS)-type transistors, and/or a vertical transistor comprising trenches of a same depth as the first trench.

17. A method of forming a transistor, the method comprising:
forming a buried well in a semiconductor substrate;
etching first and second trenches in the substrate to a depth shallower than the buried well, the first and second trenches collinear with and spaced apart from each other;
conformally depositing an electrically insulating layer on bottoms and sidewalls of the first and second trenches, and on a surface of the substrate;
filling the first and second trenches with an electrically conductive material, thereby forming first and second electrically conductive elements, respectively;
etching portions of the electrically insulating layer and the electrically conductive material over and partially into a section of the second trench;
forming a gate insulator on the electrically insulating layer, the electrically conductive material and the sidewalls of the second trench, in the section of the second trench;
depositing a gate on the gate insulator in the section of the second trench;
doping a first section of substrate adjacent to the first trench to form a semiconductor drain region, the semiconductor drain region delimited by three sides of the first trench;
doping a second section of substrate, on a side of the second trench opposite to the first section of the substrate, to form a semiconductor source region;
forming a first drift region in the semiconductor drain region; and
electrically coupling the first drift region to the first electrically conductive element.

18. The method of claim 17, further comprising:
etching a third trench in the substrate delimiting the semiconductor drain region on a side of the semiconductor drain region opposite to the first trench;
conformally depositing the electrically insulating layer on a bottom and sidewalls of the third trench;
filling the third trench with the electrically conductive material, thereby forming a third electrically conductive element in the third trench; and
electrically coupling the third electrically conductive element to the first electrically conductive element.

19. The method of claim 17, further comprising, before the etching the portions of the electrically insulating layer and the electrically conductive material:
forming a mask having an opening exposing the section of the second trench, the mask opening having a strip shape with an elongation direction orthogonal to the collinear first and second trenches.

20. The method of claim 17, further comprising forming a second drift region in the semiconductor source region.

* * * * *